(12) United States Patent
Chen et al.

(10) Patent No.: US 7,151,021 B2
(45) Date of Patent: Dec. 19, 2006

(54) BI-DIRECTIONAL READ/PROGRAM NON-VOLATILE FLOATING GATE MEMORY CELL AND ARRAY THEREOF, AND METHOD OF FORMATION

(75) Inventors: Bomy Chen, Cupertino, CA (US); Jack Frayer, Boulder Creek, CA (US); Dana Lee, Santa Clara, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 11/111,244

(22) Filed: Apr. 20, 2005

(65) Prior Publication Data
US 2005/0237807 A1 Oct. 27, 2005

Related U.S. Application Data

(62) Division of application No. 10/409,333, filed on Apr. 7, 2003, now Pat. No. 6,936,883.

(51) Int. Cl.
*H01L 21/8238* (2006.01)

(52) U.S. Cl. .................. 438/201; 438/211; 438/257; 257/E21.68; 257/E21.422; 257/E29.129

(58) Field of Classification Search ................ 438/201, 438/211, 257; 257/E21.68, E21.422, E29.129
See application file for complete search history.

(56) References Cited

U.S. PATENT DOCUMENTS

| | | | | |
|---|---|---|---|---|
| 6,151,248 A | * | 11/2000 | Harari et al. | 365/185.14 |
| 6,329,685 B1 | * | 12/2001 | Lee | 257/314 |
| 6,593,177 B1 | * | 7/2003 | Lee | 438/201 |

* cited by examiner

*Primary Examiner*—Andy Huynh
(74) *Attorney, Agent, or Firm*—DLA Piper US LLP

(57) ABSTRACT

A bi-directional read/program non-volatile memory cell and array is capable of achieving high density. Each memory cell has two spaced floating gates for storage of charges thereon. The cell has spaced apart source/drain regions with a channel therebetween, with the channel having three portions. One of the floating gate is over a first portion; another floating gate is over a second portion, and a gate electrode controls the conduction of the channel in the third portion between the first and second portions. A control gate is connected to each of the source/drain regions, and is also capacitively coupled to the floating gate. The cell programs by hot channel electron injection, and erases by Fowler-Nordheim tunneling of electrons from the floating gate to the gate electrode. Bi-directional read permits the cell to be programmed to store bits, with one bit in each floating gate.

9 Claims, 10 Drawing Sheets

BI-DIRECTIONAL READ/PROGRAM NON-VOLATILE FLOATING GATE MEMORY CELL AND ARRAY THEREOF, AND METHOD OF FORMATION

CROSS-REFERENCE TO RELATED APPLICATIONS

This application is a divisional application of U.S. patent application Ser. No. 10/409,333 filed on Apr. 7, 2003, the subject matter of which is incorporated herein by reference now U.S. Pat. No. 6,936,883.

TECHNICAL FIELD

The present invention relates to a bi-directional read/program non-volatile memory cell, that uses a floating gate for storage of charges. More particularly, the present invention relates to such non-volatile memory cell that is capable of storing a plurality of bits in a single cell and an array of such cells, and a method of manufacturing.

BACKGROUND OF THE INVENTION

Uni-directional read/program non-volatile memory cells using floating gate for storage are well known in the art. See for example, U.S. Pat. No. 5,029,130, assigned to the present assignee. Typically, each of these types of memory cells uses a conductive floating gate to store one bit, i.e. either the floating gate stores charges or it does not. The charges stored on a floating gate control the conduction of charges in a channel of a transistor. In a desire to increase the storage capacity of such non-volatile memory cells, the floating gate of such memory cell is programmed to store some charges, with the different amount of charges stored being determinative of the different states of the cell, thereby causing a plurality of bits to be stored in a single cell. The problem with programming a cell to one of a multilevel state and then reading such a state is that the amount of charge stored on the floating gate differentiating one state from another must be very carefully controlled.

Bi-directional read/program non-volatile memory cells capable of storing a plurality of bits in a single cell are also well known in the art. See, for example, U.S. Pat. No. 6,011,725. Typically, these types of memory cells use an insulating trapping material, such as silicon nitride, which is between two other insulation layers, such as silicon dioxide, to trap charges. The charges are trapped near the source/drain also to control the conduction of charges in a channel of a transistor. The cell is read in one direction to determine the state of charges trapped near one of the source/drain regions, and is read in the opposite direction to determine the state of charges trapped near the other source/drain region. Hence, these cells are read and programmed bi-directionally. The problem with these types of cells is that to erase, holes or charges of the opposite conductivity must also be "programmed" or injected into the trapping material at precisely the same location where the programming charges were initially trapped in order to "neutralize" the programming charges. Since the programming charges and the erase charges are injected into a non-conductive trapping material, the charges do not move as in a conductive material. Therefore, if there is any error in injecting the erase charges to the location of the programming charges, the erase charges will not neutralize the programming charges, and the cell will not be completely erased. Moreover, to inject the erase charges, the cell must be erased bi-directionally, thereby increasing the time required for erasure of one cell.

Hence there is a need for a non-volatile memory cell and array that overcomes these problems.

SUMMARY OF THE INVENTION

In the present invention, a non-volatile memory cell for the storage of a plurality of bits comprises a substantially single crystalline semiconductive material, such as single crystalline silicon, of a first conductivity type. A first region of a second conductivity type, different from the first conductivity type is in the substrate. A second region of the second conductivity type is also in the substrate, spaced apart from the first region. A channel region, having a first portion, a second portion and a third portion, connects the first and second regions for the conduction of charges. A dielectric is on the channel region. A first floating gate is on the dielectric, spaced apart from the first portion of the channel region. The first portion of the channel region is adjacent to the first region. The first floating gate is for the storage of at least one of the plurality of bits. A second floating gate is on the dielectric, spaced apart from the second portion of the channel region. The second portion of the channel region is adjacent to the second region. The second floating gate is for the storage of at least another of the plurality of bits. A gate electrode is on the dielectric, spaced apart from the third portion of the channel region. The third portion of the channel region is between the first portion and the second portion. A first gate electrode is electrically connected to the first region and is also capacitively coupled to the first floating gate. A second gate electrode is electrically connected to the second region and is also capacitively coupled to the second floating gate.

The present invention also relates to an array of the foregoing described non-volatile memory cells, and a method of making the non-volatile memory cell and the array.

DETAILED DESCRIPTION OF THE INVENTION

The method of the present invention is illustrated in FIGS. 1A to 1F and 2A to 2P, which show the processing steps in making the memory cell array of the present invention. The method begins with a semiconductor substrate 10, which is preferably of P type and is well known in the art. The thickness of the layers described below will depend upon the design rules and the process technology generation. What is described herein is for the 0.10 micron process. However, it will be understood by those skilled in the art that the present invention is not limited to any specific process technology generation, nor to any specific value in any of the process parameters described hereinafter.

Isolation Region Formation

Figure 1A:
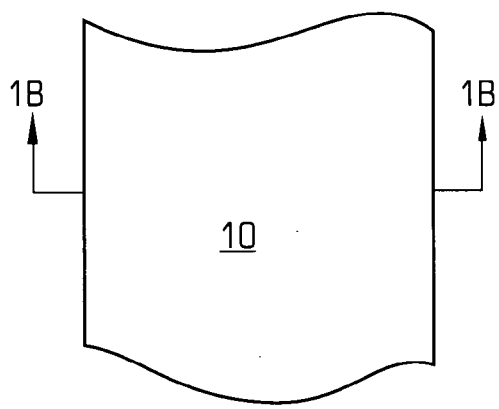
FIG. 1A is a top view of a semiconductor substrate used in the first step of the method of present invention to form isolation regions.
Figure 1B:
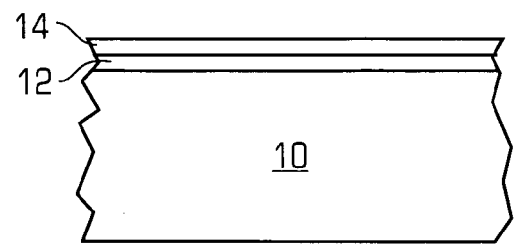
FIG. 1B is a cross sectional view of the structure taken along the line 1B—1B showing the initial processing steps of the present invention.

FIGS. 1A to 1F illustrate the well known STI method of forming isolation regions on a substrate. Referring to FIG. 1A there is shown a top plan view of a semiconductor substrate 10 (or a semiconductor well), which is preferably of P type and is well known in the art. First and second layers of material 12 and 14 are formed (e.g. grown or deposited) on the substrate. For example, first layer 12 can be silicon dioxide (hereinafter "oxide"), which is formed on the substrate 10 by any well known technique such as oxidation or oxide deposition (e.g. chemical vapor deposition or CVD) to a thickness of approximately 60–150 angstroms. Second layer 14 can be silicon nitride (hereinafter "nitride"), which is formed over oxide layer 12 preferably by CVD to a thickness of approximately 1000–2000 angstroms. FIG. 1B illustrates a cross-section of the resulting structure.

Figure 1C:
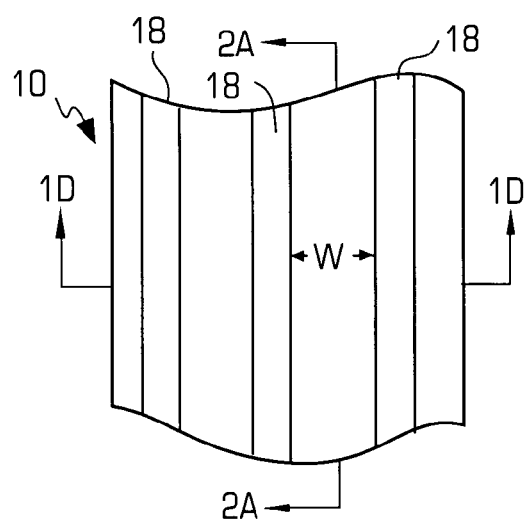
FIG. 1C is a top view of the structure showing the next step in the processing of the structure of FIG. 1B, in which isolation regions are defined.
Figure 1D:
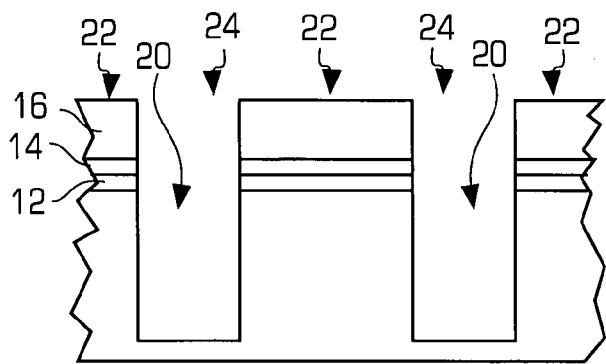
FIG. 1D is a cross sectional view of the structure in FIG. 1C taken along the line 1D—1D showing the isolation trenches formed in the structure.

Once the first and second layers 12/14 have been formed, suitable photo resist material 16 is applied on the nitride layer 14 and a masking step is performed to selectively remove the photo resist material from certain regions (stripes 18) that extend in the Y or column direction, as shown in FIG. 1C. Where the photo-resist material 16 is removed, the exposed nitride layer 14 and oxide layer 12 are etched away in stripes 18 using standard etching techniques (i.e. anisotropic nitride and oxide etch processes) to form trenches 20 in the structure. The distance W between adjacent stripes 18 can be as small as the smallest lithographic feature of the process used. A silicon etch process is then used to extend trenches 20 down into the silicon substrate 10 to a depth of approximately 500–4000 angstroms, as shown in FIG. 1D. Where the photo resist 16 is not removed, the nitride layer 14 and oxide layer 12 are maintained. The resulting structure illustrated in FIG. 1D now defines active regions 22 interlaced with isolation regions 24.

Figure 1E:
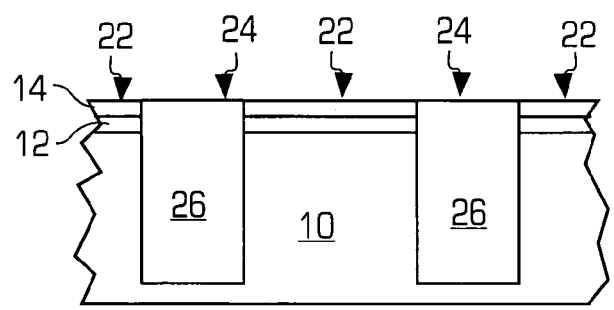
FIG. 1E is a cross sectional view of the structure in FIG. 1D showing the formation of isolation blocks of material in the isolation trenches.

The structure is further processed to remove the remaining photo resist 16. Then, an isolation material such as silicon dioxide is formed in trenches 20 by depositing a thick oxide layer, followed by a Chemical-Mechanical-Polishing or CMP etch (using nitride layer 14 as an etch stop) to remove the oxide layer except for oxide blocks 26 in trenches 20, as shown in FIG. 1E. The remaining nitride and oxide layers 14/12 are then removed using nitride/oxide etch processes, leaving STI oxide blocks 26 extending along isolation regions 24, as shown in FIG. 1F.

The STI isolation method described above is the preferred method of forming isolation regions 24. However, the well known LOCOS isolation method (e.g. recessed LOCOS, poly buffered LOCOS, etc.) could alternately be used, where the trenches 20 may not extend into the substrate, and isolation material may be formed on the substrate surface in stripe regions 18. FIGS. 1A to 1F illustrate the memory cell array region of the substrate, in which columns of memory cells will be formed in the active regions 22 which are separated by the isolation regions 24. It should be noted that the substrate 10 also includes at least one periphery region in which control circuitry is formed that will be used to operate the memory cells formed in the memory cell array region. Preferably, isolation blocks 26 are also formed in the periphery region during the same STI or LOCOS process described above.

Memory Cell Formation

Figure 1F:
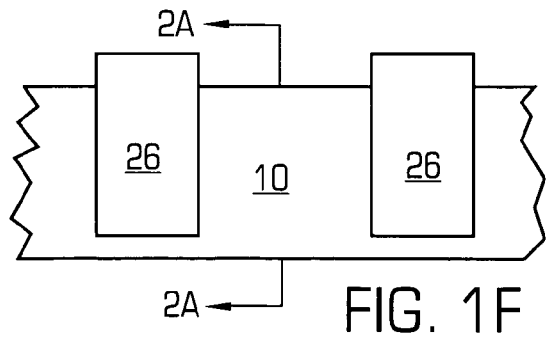
FIG. 1F is a cross sectional view of the structure in FIG. 1E showing the final structure of the isolation regions.
Figure 2A:
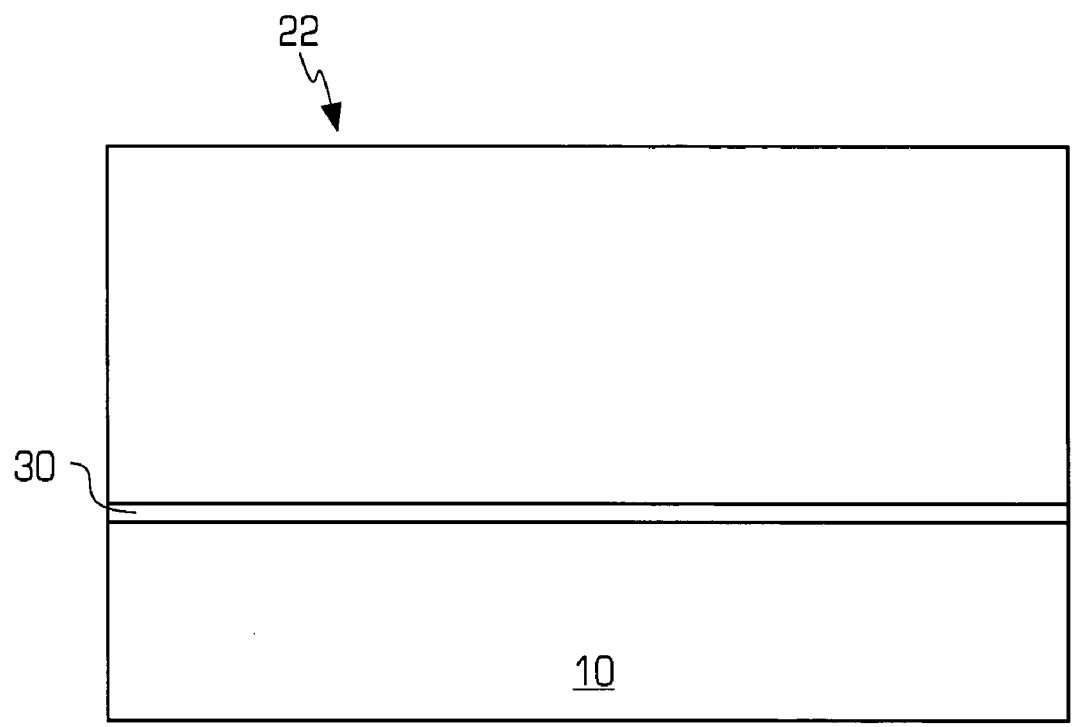
FIGS. 2A–2P are cross sectional views of the semiconductor structure in FIG. 1F taken along the line 2A—2A showing in sequence the steps in the processing of the semiconductor structure in the formation of a non-volatile memory array of floating gate memory cells of the present invention.

The structure shown in FIG. 1F is further processed as follows. FIGS. 2A to 2Q show the cross sections of the structure in the active regions 22 from a view orthogonal to that of FIG. 1F (along line 2A—2A as shown in FIGS. 1C and 1F).

An insulation layer 30 (preferably oxide) is first formed over the substrate 10, as shown in FIG. 2A. The active region 22 portion of the substrate 10 can be doped at this time for better independent control of the cell array portion of the memory device relative to the periphery region. Such doping is often referred to as a $V_t$ implant or cell well implant, and is well known in the art. During this implant, the periphery region is protected by a photo resist layer, which is deposited over the entire structure and removed from just the memory cell array region of the substrate.

Figure 2B:
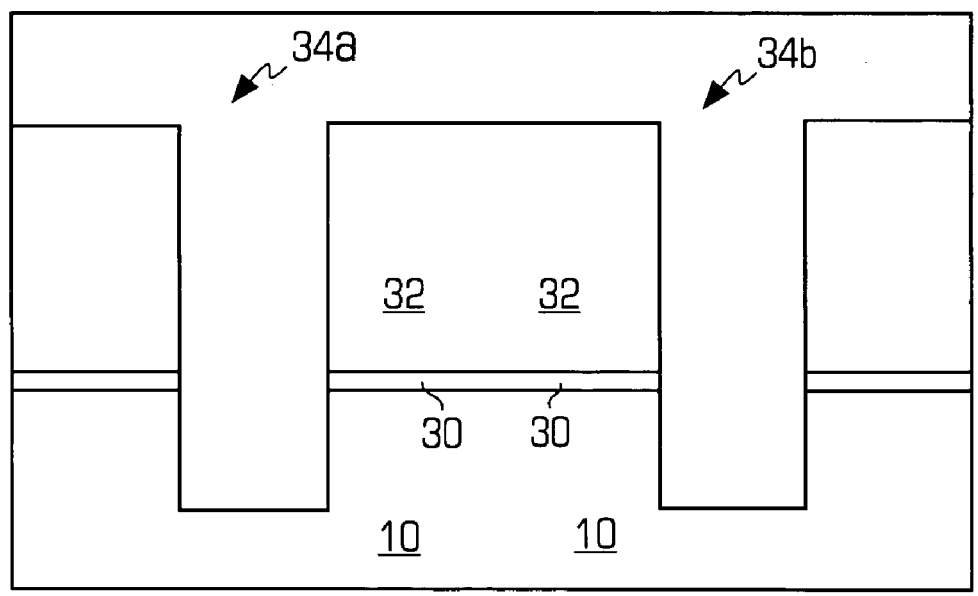

Next, a thick layer of hard mask material 32 such as nitride is formed over oxide layer 30 (e.g. ~3500 Å thick). A plurality of parallel second trenches 34 are formed in the nitride layer 32 by applying a photo resist (masking) material on the nitride layer 32, and then performing a masking step to remove the photo resist material from selected parallel stripe regions. An anisotropic nitride etch is used to remove the exposed portions of nitride layer 32 in the stripe regions, leaving second trenches 34 that extend down to and expose oxide layer 30. After the photo resist is removed, an anisotropic oxide etch is used to remove the exposed portions of oxide layer 30 and extend second trenches 34 down to the substrate 10. A silicon anisotropic etch process is then used to extend second trenches 34 down into the substrate 10 in each of the active regions 22 (for example, down to a depth of approximately one feature size deep, e.g. about 0.15 um deep with 0.15 um technology). Alternately, the photo resist can be removed after trenches 34 are formed into the substrate 10. The resulting active region 22 is shown in FIG. 2B.

Figure 2C:
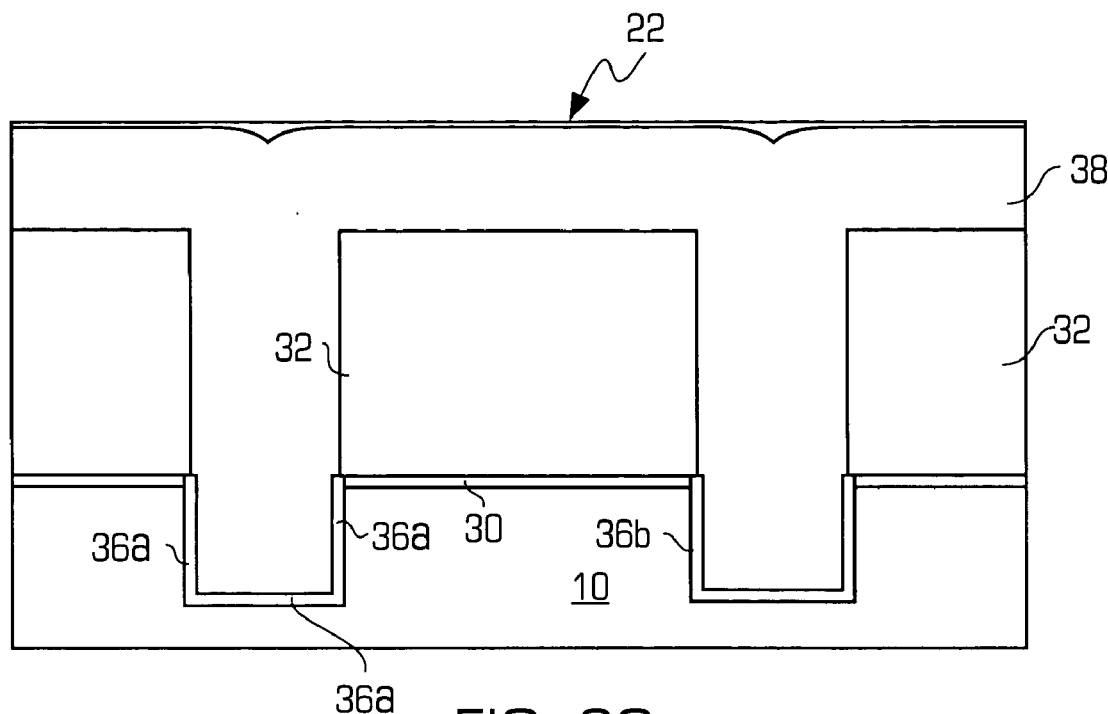

A layer of insulation material 36 is next formed (preferably using a thermal oxidation process) along the exposed silicon in second trenches 34 that forms the-bottom and lower sidewalls of the second trenches 34 (e.g. ~70 Å to 120 Å thick). A thick layer of polysilicon 38 (hereinafter "poly") is then formed over the structure, which fills second trenches 34. Poly layer 38 can be doped (e.g. n+) by ion implant, or by an in-situ process. The resulting active region 22 is shown in FIG. 2C.

Figure 2D:
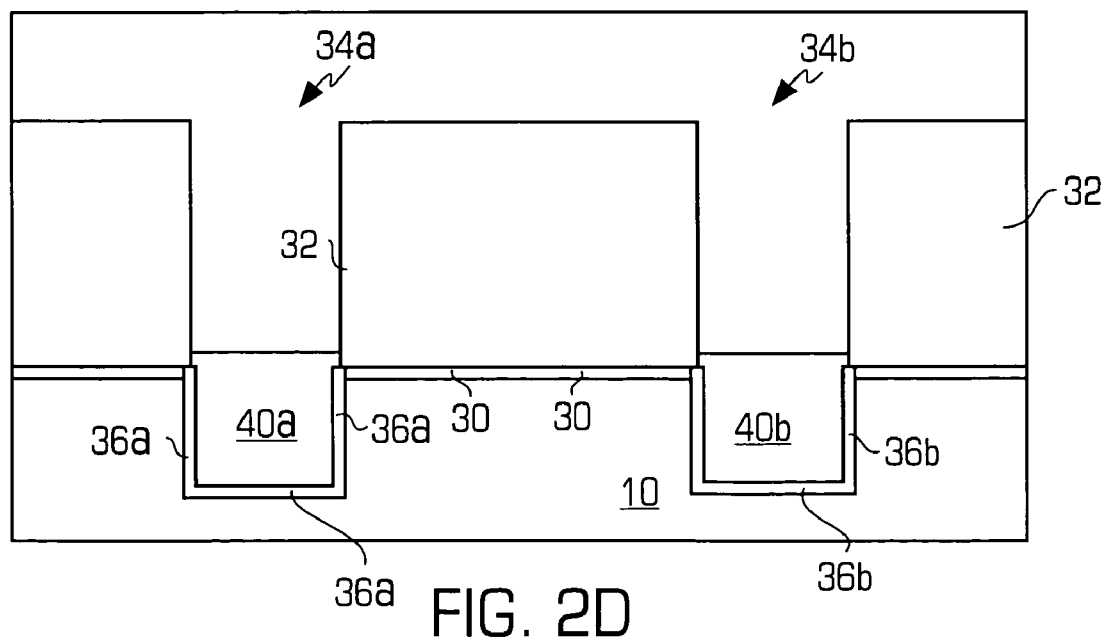

A poly etch process (e.g. a CMP process using nitride layer 32 as an etch stop) is used to remove poly layer 38 except for blocks 40 of the polysilicon 38 left remaining in second trenches 34. A controlled poly etch is then used to lower the height of poly blocks 40, where the tops of poly blocks 40 are disposed above the surface of the substrate, but below the tops of STI blocks 26 in the isolation regions 24, as shown in FIG. 2D.

Figure 2E:
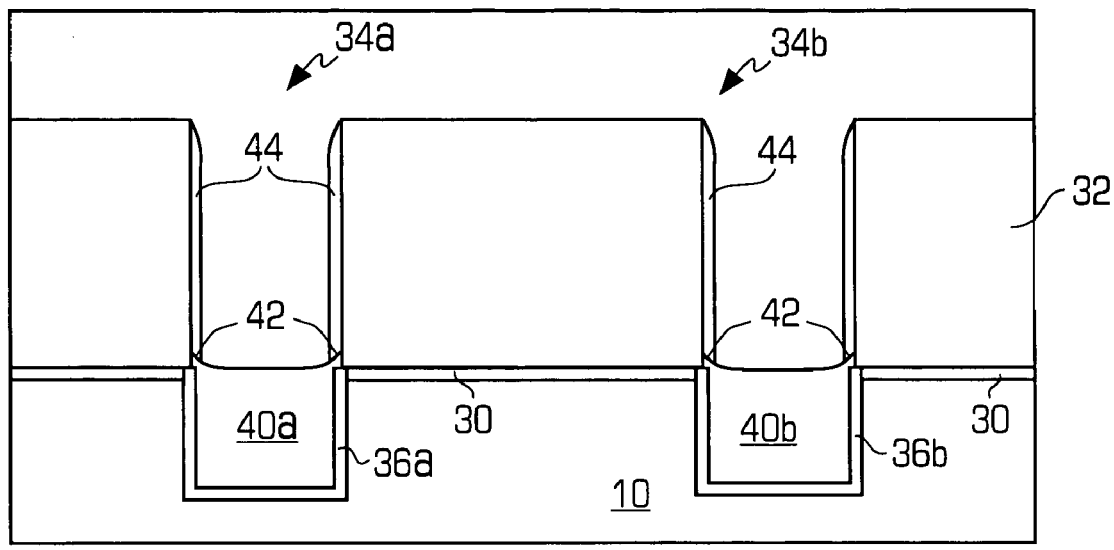

Another poly etch is then performed to create sloped portions 42 on the tops of poly blocks 40 (adjacent the second trench sidewalls). Nitride spacers 44 are then formed along the second trench sidewalls and over the sloped portions 42 of poly blocks 40. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure. Spacers 44 can be formed of any dielectric material, such as oxide, nitride, etc. In the present embodiment, insulating spacers 44 are formed by depositing a layer of nitride over the entire structure, followed by an anisotropic nitride etch process, such as the well known Reactive Ion Etch (RIE), to remove the deposited nitride layer except for spacers 44. The resulting active region 22 is shown in FIG. 2E. It should be noted that the formation of nitride spacers 44 is optional, as the spacers 44 are used to enhance the sharpness of the tips formed by the sloped portions 42 of poly blocks 40. Thus, FIGS. 2F–2Q show the remaining processing steps without the optional nitride spacers 44.

Figure 2F:
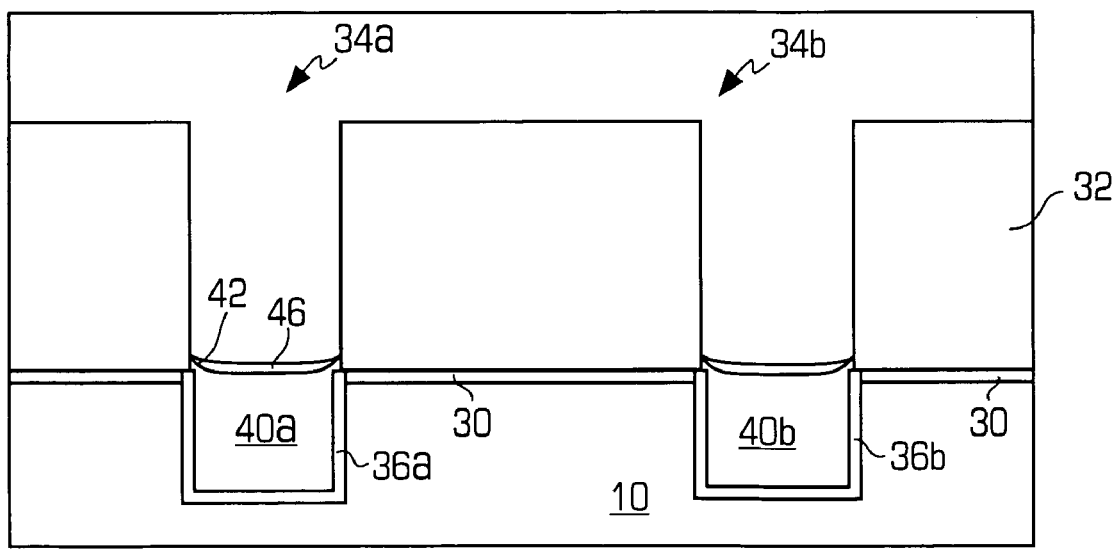
Figure 2G:
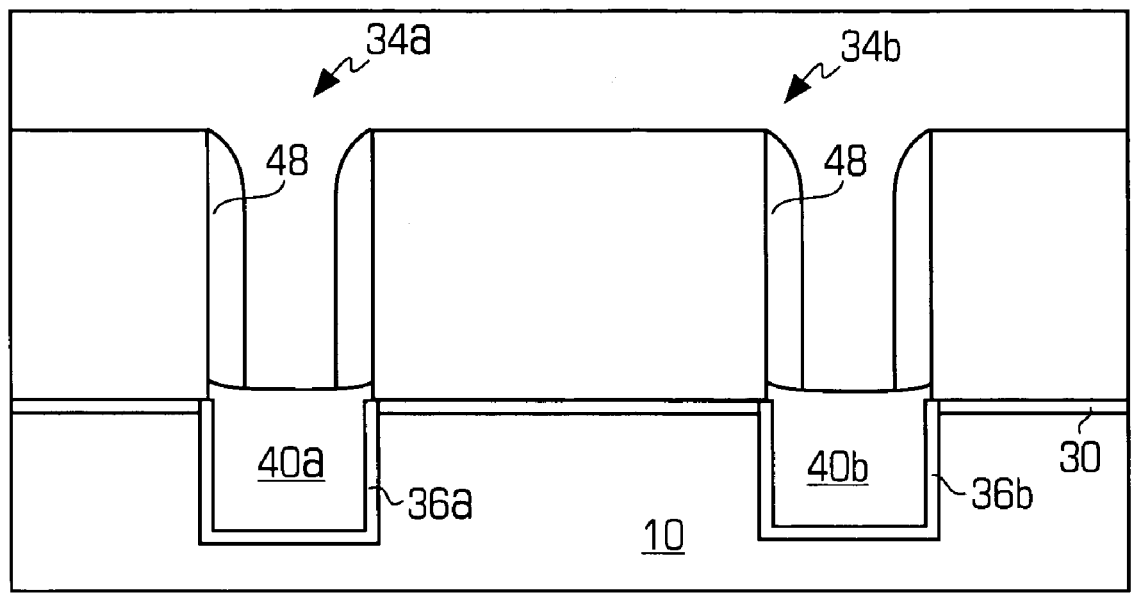

A thermal oxidation process is then performed, which oxidizes the exposed top surfaces of the poly blocks 40 (forming oxide layer 46 thereon), as shown in FIG. 2F. Oxide spacers 48 (shown in FIG. 2G) are then formed along the sidewalls of the second trenches 34 by depositing oxide over the structure (e.g. approximately 350 Å thickness) followed by an anisotropic oxide etch. The oxide etch also removes the center portion of oxide layer 46 in each of the second trenches 34. The resulting active region 22 is shown in FIG. 2G.

Figure 2H:
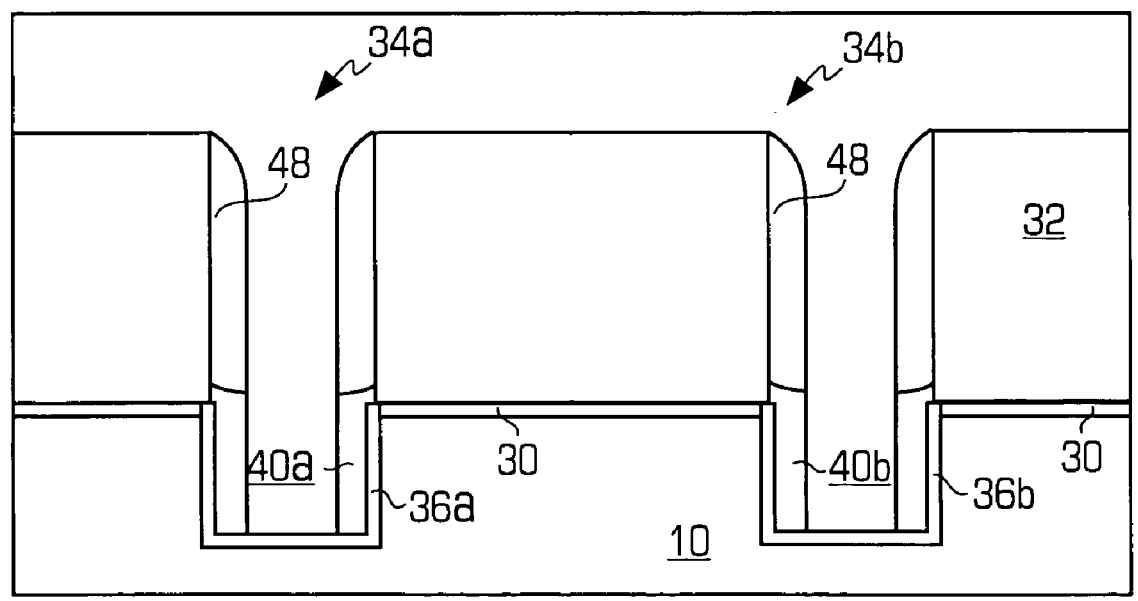
Figure 2I:
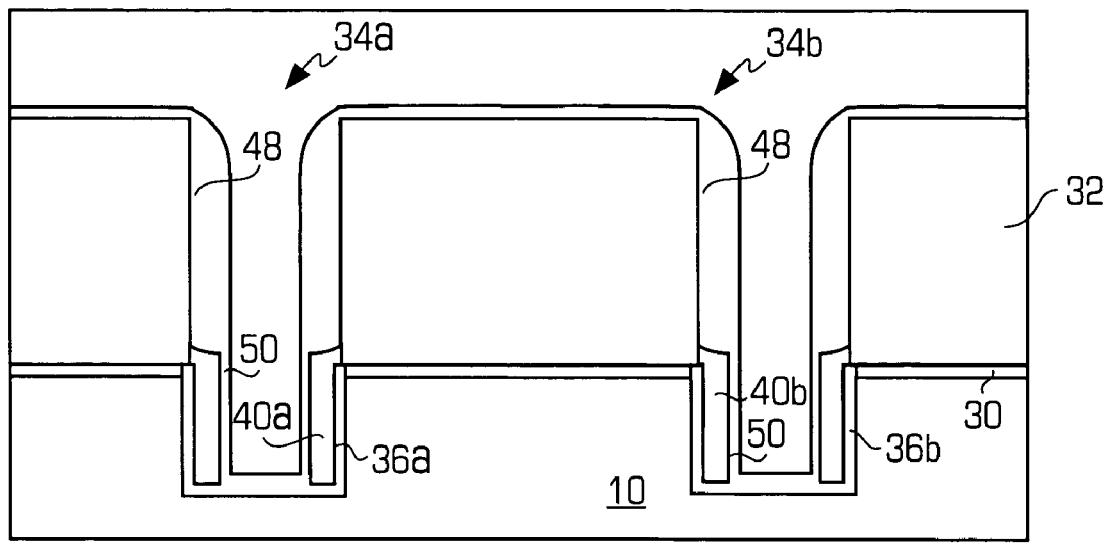
Figure 2J:
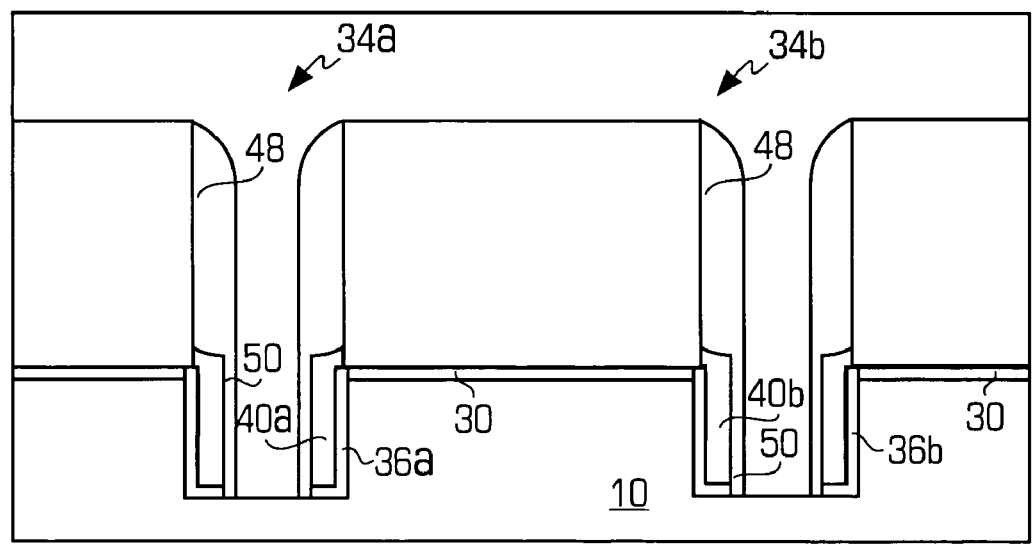
Figure 2K:
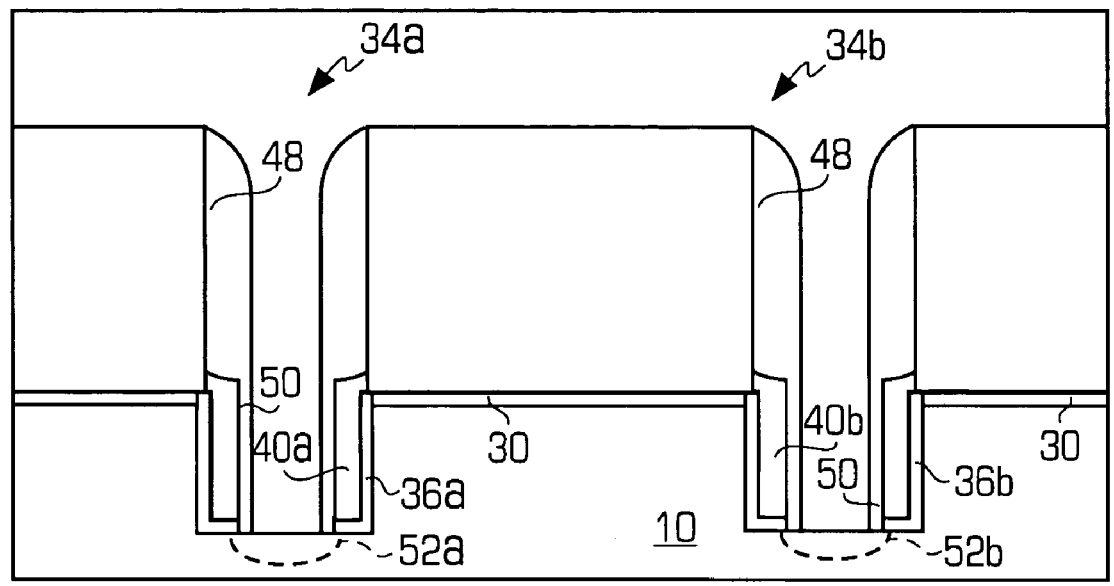

An anisotropic poly etch is next performed, which removes the center portions of the poly blocks 40 that are not protected by oxide spacers 48, leaving a pair of opposing poly blocks 40a in each of the second trenches 34, as shown in FIG. 2H. An insulation deposition and anisotropic etchback process is then used to form an insulation layer 50 along the exposed sides of poly blocks 40a inside second trenches 34 (shown in FIG. 2I). The insulation material could be any insulation material (e.g. ONO—oxide/nitride/oxide, or other high dielectric materials). Preferably, the insulation material is oxide, so that the oxide deposition/etch process also thickens the oxide spacers 48 and results in the removal of the exposed portions of oxide layer 36 at the bottom of each second trench 34 to expose the substrate 10, as shown in FIG. 2K.

Suitable ion implantation (and possible anneal) is then made across the surface of the structure to form first (source) regions 52 in the exposed substrate portions at the bottom of second trenches 34. The source regions 52 are self-aligned to the second trenches 34, and have a second conductivity type (e.g. N type) that is different from a first conductivity type of the substrate (e.g. P type). The ions have no significant effect on the nitride layer 32. The resulting active region 22 is shown in FIG. 2K.

Figure 2L:
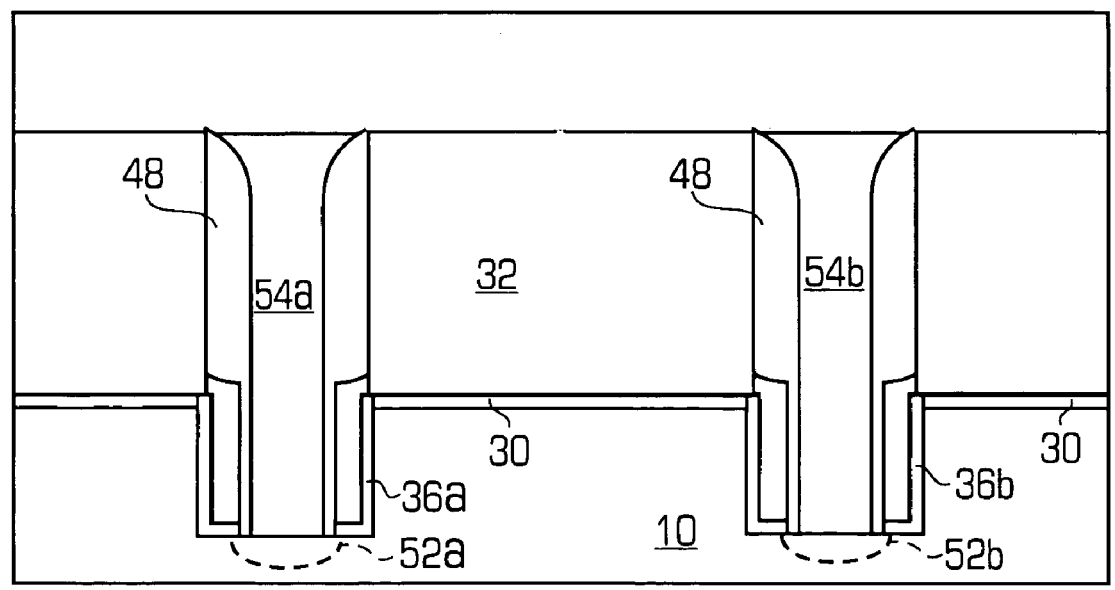
Figure 2M:
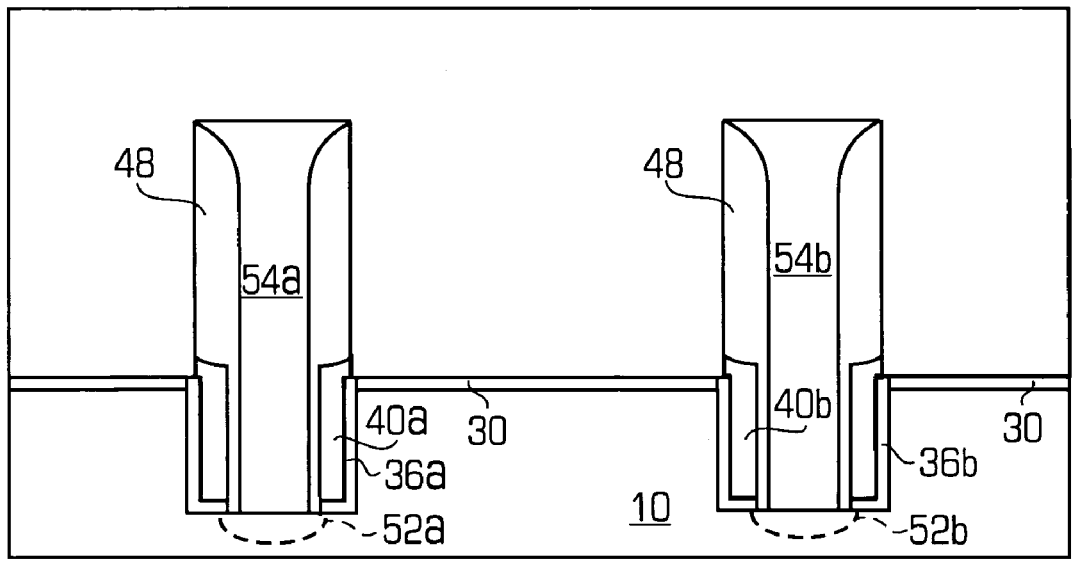
Figure 2N:
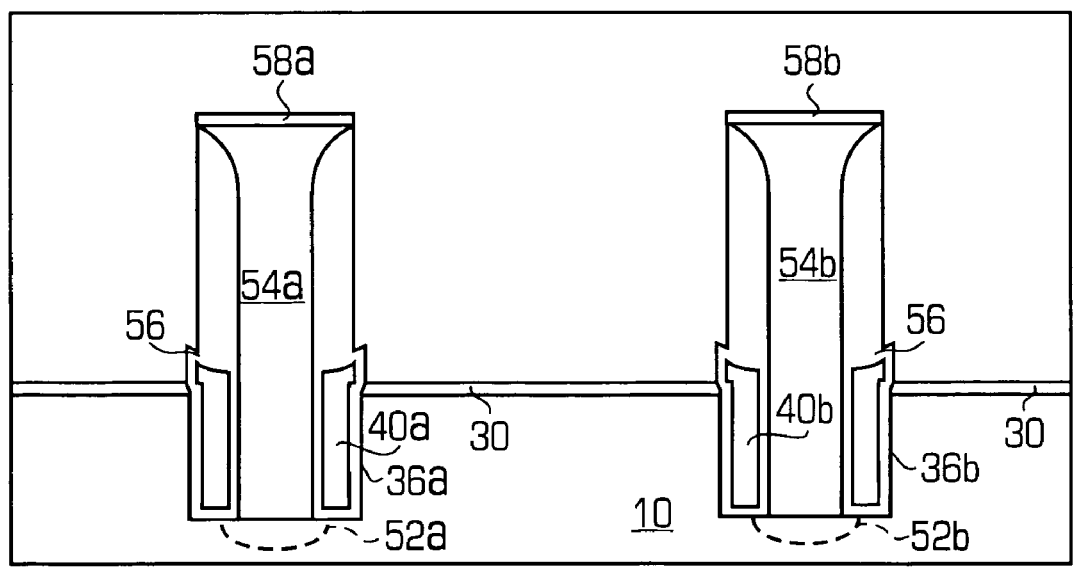

A poly deposition step, followed by a poly CMP etch (using the nitride layer 32 as an etch stop) are used to fill second trenches 34 with poly blocks 54, as shown in FIG. 2L. A nitride etch follows, which removes nitride layer 32, and exposes upper edges of the poly blocks 40a. A tunnel oxide layer 56 is next formed on the exposed upper edges of poly blocks 40a, either by thermal oxidation, oxide deposition, or both. This oxide formation step also forms an oxide layer 58 on the exposed top surfaces of poly blocks 54, as well as possibly thickening oxide layer 30 over substrate 10. Optional Vt implantation in the periphery region can be performed at this time by masking off the active regions 22. The resulting active region 22 is shown in FIG. 2M and 2N.

Figure 2O:
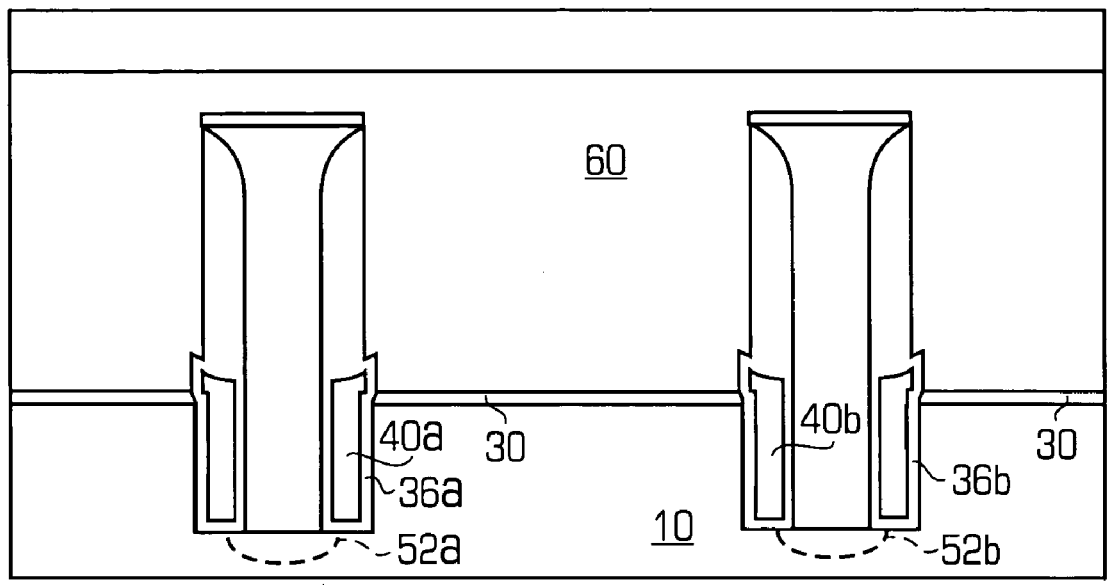

The oxide layer 30 serves as the gate oxide for both the memory cells in the active regions, and the control circuitry in the periphery region. For each device, the thickness of the gate oxide dictate's its maximum operating voltage. Thus, if it is desired that some of the control circuitry operate at a different voltage than the memory cells or other devices of the control circuitry, then the thickness of the gate oxide 32 can be modified at this point in the process. In way of example but not limitation, photo resist 60 is formed over the structure, followed by a masking step for selectively removing portions of the photo resist in the periphery region to expose portions of oxide layer 30. The exposed portions of oxide layer 30 can be thinned (e.g. by using a controlled etch) or replaced (e.g. by an oxide etch and oxide deposition) with oxide layer 30a having the desired thickness, as illustrated in FIG. 2O.

Figure 2P:
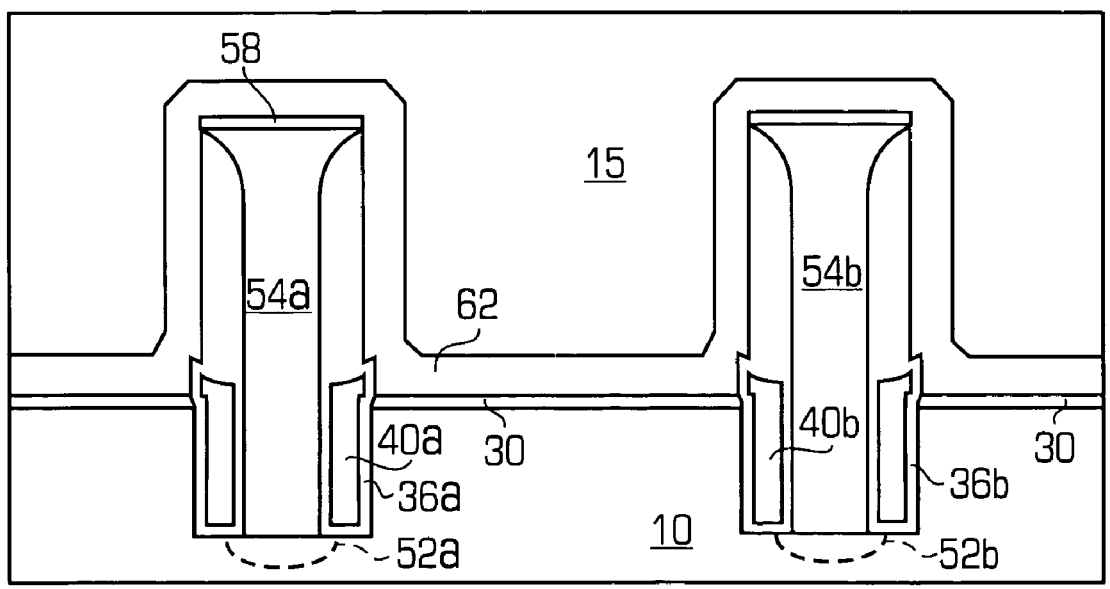

After removal of photo resist 60, a poly deposition step is used to form a poly layer 62 over the structure (e.g. approximately 500 Å thick). Photo resist deposition and masking steps follow to form strips of poly layer 62 that are spaced apart from one another each over an active region 22. The resulting active region 22 is shown in FIG. 2P. Each poly layer 62 functions as a word line for the memory array.

As shown in FIG. 2P, the process of the present invention forms an array of memory cells, with each memory cell 15 being between a pair of spaced apart source/drain regions 52(a,b) (those skilled in the art would appreciated that the term source and drain may be interchanged during operation.) A non-planar channel region connects the two source regions 52(a,b), with the channel region having three portions: a first portion, a second portion and a third portion. The first portion of the channel region is along one of the sidewall of one of the trenches 34, and is adjacent to the first source region 52a. The second portion of the channel region is along one of the sidewall of the other trench 34, and is adjacent to the second source region 52b. A third portion of the channel region is between the first portion and the second portion and is substantially along the top surface of the substrate 10. A dielectric layer is over the channel region. Over the first portion of the channel region, the dielectric is the layer 36a. Over the second portion of the channel, the dielectric is the layer 36b. Over the third portion of the channel region, the dielectric is the layer 30. A first floating gate 40a is on the layer 36a, and is over the first portion of the channel region, which is adjacent to the first source region 52a. A second floating gate 40b is on the layer 36b, and is over the second portion of the channel region, which is adjacent to the second source region 52b. A gate electrode 62, formed by the poly layer 62, is over the dielectric layer 30 and is over the third portion of the channel region. A first control gate 54a is connected to the first source region 52a, and is capacitively coupled to the first floating gate 40a. A second control gate 54b is connected to the second source region 52b, and is capacitively coupled to the second floating gate 40b. Further, each of the floating gates 40a and 40b is substantially perpendicular to the gate electrode 62 and to the surface of the substrate 10. Finally, each source region, e.g. first source region 52a, and its associated control gate, e.g. first control gate 54a is shared with an adjacent memory cell 15 in the same active region 22.

The floating gates 40(a,b) are disposed in trenches 34, with each floating gate facing and insulated from a portion of the channel region. Further, each floating gate 40 (a,b) includes an upper portion that extends above the substrate surface and terminates in an edge that faces and is insulated from one of the control gates 62, thus providing a path for Fowler-Nordheim tunneling through oxide layer 56. Each control gate 54 extends along and are insulated (by oxide layer 50) from floating gates 44, for enhanced voltage coupling therebetween.

With respect to the plurality of memory cells 15 that form an array, the interconnection is as follows. For memory cells 15 that are in the same column, i.e. in the same active region 22, the word line 62 that forms the gate electrode for each memory cell 15 is extended in the Y direction to each of the memory cells 15. For memory cells 15 that are in the same row, i.e. across the active regions 22 and the STI 26, the source lines 52(a,b) and/or the associated control gates 54(a,b) are extended in the X direction to each of those memory cells 15. Because the source regions 52(a,b) are in a trench 34, they may be in the active regions 22 only, bound by the STI 26, and thus forming islands. In that event, the associated control gates 54(a,b) that extend in the X direction and are above the surface of the substrate 10 form the connection between the memory cells 15 that are in the same row. Alternatively, immediately prior to the formation of the source regions 52 as shown and as described in FIG. 2K, the STI 26 may be removed from the isolation regions. The formation of the source regions 52 thereafter would form a continuous connection between the memory cells 15 that are in the row direction and extend in the X direction. Of course, the subsequent formation of the associated control gates 54(a,b) would also connect the memory cells 15 in the row direction. Finally, as can be seen from the foregoing, memory cells 15 in adjacent rows, share the same source region 52 and the same associated control gate 54.

Memory Cell Operation

The operation of the memory cell 15 shown in FIG. 2P will now be described.

Erase

The memory cell 15 is erased by applying 0 volts to the control gates 54(a,b), which are connected to the source regions 52(a,b). Since the same voltage is applied to both source regions 52(a,b), no charges will conduct in the channel region. Furthermore, because the control gates 54(a,b) are highly capacitively coupled to the floating gates 40(a,b), the floating gates 40(a,b) will experience a low voltage. A voltage of between 8 to 12 volts is applied to the word line 62. This causes a large voltage differential between the floating gates 40(a,b) and the word line 62. Any electrons stored on the floating gates 40(a,b) are pulled by the positive voltage applied to the word line 62, and through the mechanism of Fowler-Nordheim tunneling, the electrons are removed from the floating gates 40(a,b), and tunnel through the tunneling oxide 56 onto the word line 62. This mechanism of poly-to-poly tunneling for erase is set forth in U.S. Pat. No. 5,029,130, whose disclosure is incorporated herein in its entirety by reference.

Programming

Programming of the memory cell 15 can occur in one of two mechanisms: either the first floating gate 40a is programmed or the second floating gate 40b is programmed. Let us first discuss the action of programming the first floating gate 40a, i.e. storage of electrons on the first floating gate 40a. The first source-region 52a and the first control gate 54a are held at a positive voltage of between 10 to 15 volts. The word line is held at a positive voltage of 1–2 volts. The second source region 52b and the second control gate 54b are held at a positive voltage of between 2–5 volts. The positive voltage of 2–5 volts on the second source region 52b and the second control gate 54b are sufficient to turn on the second portion of the channel region, even if the second floating gate 40b is programmed, i.e. has electrons stored thereon. The positive voltage of 1–2 volts on the word line 62 is sufficient to turn on the third portion of the channel region. The positive voltage of 10–15 volts on the first source region 52a and the first control gate 54a are sufficient to turn on the first portion of the channel region. Thus, electrons will traverse in the channel region from the second source region 54b to the first source region 54a. However, at the junction in the channel region where the channel region takes substantially a 90 degree turn in the direction from the planar surface to the first trench 34a, the electrons will experience a sudden increase in voltage, caused by the positive high voltage on the first control gate 54a being capacitively coupled to the first floating gate 40a. This causes the electrons to be hot channel injected onto the first floating gate 40a. This mechanism of hot channel electron injection for programming is set forth in U.S. Pat. No. 5,029,130, whose disclosure is incorporated herein in its entirety by reference.

To program the second floating gate 40b, the voltages applied to the first control gate 54a/first source region 52a are reversed from those applied to the second control gate 54b/second source region 52b.

Read

Reading of the memory cell 15 can occur in one of two mechanisms: either the state of the first floating gate 40a is read, or the state of the second floating gate 40b is read. Let us first discuss the action of reading the state of the first floating gate 40a, whether electrons are stored on the first floating gate 40a. The first source region 52a and the first control gate 54a are held at a positive voltage of between 0 to 1 volts. The word line is held at a positive voltage of 1.5–2.5 volts. The second source region 52b and the second control gate 54b are held at a positive voltage of between 2–5 volts. The positive voltage of 2–5 volts on the second source region 52b and the second control gate 54b are sufficient to turn on the second portion of the channel region, even if the second floating gate 40b is programmed, i.e. has electrons stored thereon. The positive voltage of 1.5–2.5 volts on the word line 62 is sufficient to turn on the third portion of the channel region. The positive voltage of between 0 to 1 volt on the first source region 52a and the first control gate 54a are sufficient to turn on the first portion of the channel region only if the first floating gate 40a is not programmed. In that event, electrons will traverse in the channel region from the first source region 54a to the second source region 54b. However, if the first floating gate 40a is programmed, then the positive voltage of between 0 to 1 volt is not sufficient to turn on the first portion of the channel region. In that event, the channel remains non-conductive. Thus, the amount of current or the presence/absence of current sensed at the second source region 52b determines the state of programming of the first floating gate 40a.

To read the second floating gate 40b, the voltages applied to the first control gate 54a/first source region 52a are reversed from those applied to the second control gate 54b/second source region 52b.

Memory Cell Array Operation

Figure 3:
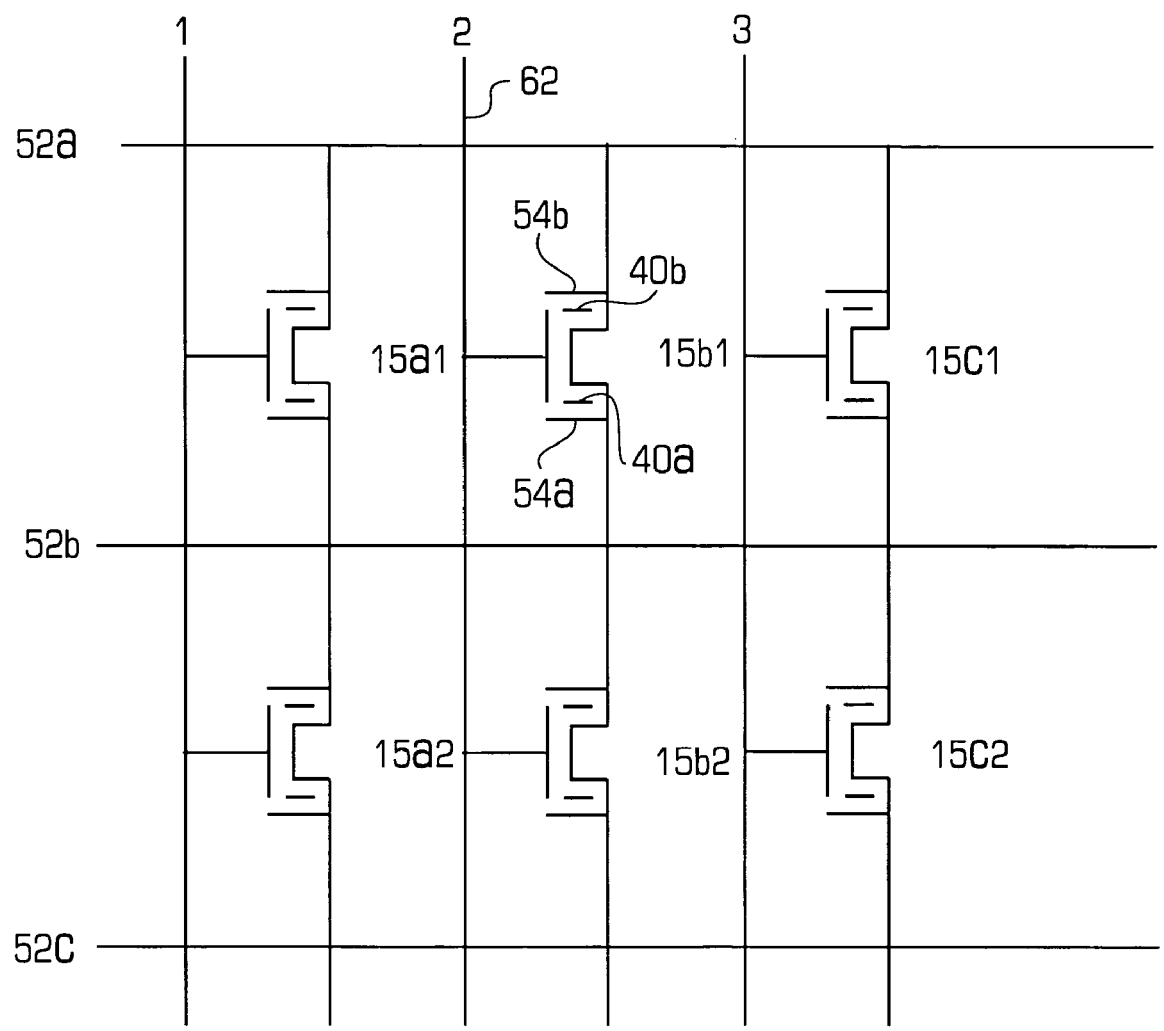
FIG. 3 is a schematic circuit diagram of the memory cell array of the present invention.

The operation of an array of memory cells 15 will now be described. Schematically, an array of memory cells is shown in FIG. 3. As shown in FIG. 3, an array of memory cells 15 comprises a plurality of memory cells arranged in a plurality of columns: 15a(1–k), 15b(1–k), and 15c(1–k) and in rows: 15(a–n)1 and 15(a–n)2. The word line 62 connected to a memory cell 15 is also connected to other memory cells 15 in the same column. The first and second source regions 52 and the first and second control gates 54 connected to a memory cell 15 are also connected to other memory cells in the same row.

Erase

In the erase operation, memory cells 15 in the same column connected by the common word line 62 are erased simultaneously. Thus, for example, if it is desired to erase memory cells 15 in the column 15*b*(1–n), the word line 2 is held at between 8 to 12 volts. The unselected word lines 1 and 3 are held at 0 volts. All the source region/control gate lines, i.e. lines 52A, 52B, and 52C are also held at 0 volts. In this manner all of the memory cells 15*b*(1–n) are erased simultaneously, while no erase disturbance occurs with respect to the memory cells in the other columns.

Program

Let us assume that the first floating gate 40*a* of the memory cell 15*b*1 is to be programmed. Then based upon the foregoing discussion, the voltages applied to the various lines are as follows: line 2 at a positive voltage between 1 to 2 volts; line 52A at a positive voltage between 2 to 5 volt, and line 52B at a positive voltage between 10 and 15 volts.

The voltages applied to the unselected word lines 62 and the unselected source regions/control gates are as follows: lines 1 and 3, 0 volts, and line 52C at 0 volts. The "disturbance" on the unselected memory cells 15 is as follows:

For the memory cells 15 in the unselected column, the application of 0 volts to lines 1 and 3 means that none of the channel regions for those memory cells 15*c*(1–n) and 15*a*(1–n) are turned on. Thus, there is no disturbance. For the memory cell 15*b*2 which is in the same selected column, but in an unselected row, the application of 0 volts to line 52C means that the portion of the channel region of the memory cell 15*b*2 which is adjacent to the source region 52C will not be turned on. In that event the channel between the source region connected to line 52C and the source region connected to line 52B will be turned off. Thus, little or no disturbance to memory cell 15*b*2 would occur.

The programming of the second floating gate 40*b* of the memory cell 15*b*1 will have the following voltages applied to the various lines: line 2 at a positive voltage between 1.5 to 2.5 volts; line 52B at a positive voltage between 2 to 5 volt, and line 52A at a positive voltage between 10 and 15 volts, with all the unselected word lines and unselected row lines held at 0 volts.

Read

Let us assume that the second floating gate 40*b* of the memory cell 15*b*1 is to be read. Then based upon the foregoing discussion, the voltages applied to the various lines are as follows: line 2 at a positive voltage between 1.5 to 2.5 volts; line 52A at a positive voltage between 0 and 1 volt, and line 52B at a positive voltage between 2 and 5 volts.

The voltages applied to the unselected word lines 62 and the unselected source regions/control gates are as follows: lines 1 and 3, 0 volts, and line 52C at 0 volts. The "disturbance" on the unselected memory cells 15 is as follows:

For the memory cells 15 in the unselected column, the application of 0 volts to lines 1 and 3 means that none of the channel regions for those memory cells 15*c*(1–n) and 15*a*(1–n) are turned on. Thus, there is no disturbance. For the memory cell 15*b*2 which is in the same selected column, but in an unselected row, the application of 0 volts to line 52C means that the portion of the channel region of the memory cell 15*b*2 which is adjacent to the source region 52C will not be turned on. In that event the channel between the source region 52C and the source region 52B will be turned off. Thus, little or no disturbance to memory cell 15*b*2 would occur.

The reading of the first floating gate 40*a* of the memory cell 15*b*1 will have the following voltages applied to the various lines: line 2 at a positive voltage between 1.5 to 2.5 volts; line 52A at a positive voltage between 2 to 5 volt, and line 52B at a positive voltage between 0 and 1 volt, with all the unselected word lines and unselected row lines held at 0 volts.

As will be appreciated by those skilled in the art, lines 52A, 52B, and 52C are buried diffusion lines, and contacts must be made to those lines outside of the array of memory cells. One approach is to use a control gate 54 to contact the buried diffusion line 52 which is electrically connected to the buried diffusion, and to the control gate in the memory array.

From the foregoing it can be seen that a novel, high density non-volatile memory cell, array and method of manufacturing is disclosed. It should be appreciated that although the preferred embodiment has been described in which a single bit is stored in each of the two floating gates in a memory cell, it is also within the spirit of the present invention to store multi-bits on each one of the floating gates in a single memory cell, thereby increasing further the density of storage.

What is claimed is:

1. A method of manufacturing an array of non-volatile memory cells in a substantially single crystalline semiconductive substrate of a first conductivity type, wherein said array of non-volatile memory cells has a plurality of non-volatile memory cells arranged in a plurality of rows and columns in said semiconductive substrate with each cell for storing a plurality of bits, said method comprising:

forming spaced apart isolation regions on said semiconductive substrate that are substantially parallel to one another and extend in a said column direction, with an active region between each pair of adjacent isolation regions, wherein said semiconducive substrate has a surface;

forming a plurality of memory cells in each of the active regions, wherein each memory cell for the storage of a plurality of bits, wherein the formation of each of the memory cells includes:

forming a first and a second spaced apart trenches into the surface of the substrate, each of said first and second trenches having a sidewall and a bottom wall;

forming a first region and a second region in said bottom wall of said first and second trenches, respectively, with said first region and said second region being of a second conductivity type, different from said first conductivity type, with a channel region for the conduction of charges connecting said first region and said second region; said channel region, having a first portion, a second portion and a third portion;

forming a dielectric on said channel region;

forming a first floating gate on said dielectric, in said first trench spaced apart from said sidewall of said first trench and from said first portion of said channel region; said first portion of said channel region adjacent to said first region, said first floating gate for the storage of at least one of said plurality of bits;

forming a second floating gate on said dielectric, in said second trench spaced apart from said sidewall of said second trench and from said second portion of said channel region; said second portion of said channel region adjacent to said second region, said second floating gate for the storage of at least another of said plurality of bits;

forming a gate electrode on said dielectric, spaced apart from said third portion of said channel region, said third portion of said channel region between said first portion and said second portion;

forming a first gate electrode in said first trench, said first gate electrode electrically connected to said first region and capacitively coupled to said first floating gate; and forming a second gate electrode in said second trench, said second gate electrode electrically connected to said second region and capacitively coupled to said second floating gate.

2. The method of claim 1 wherein said step of forming said first gate electrode includes forming said first gate electrode continuously in said row direction across a plurality of columns.

3. The method of claim 2 wherein said step of forming said second gate electrode includes forming said second gate electrode continuously in said row direction across a plurality of columns.

4. The method of claim 3 wherein said step of forming said first region and said second region includes forming said first region and said second region continuously in said row direction across a plurality of columns.

5. The method of claim 3 wherein said step of forming said first region and said second region includes forming said first region and said second region in only one column of active region.

6. The method of claim 3 wherein said step of forming said gate electrode includes forming said gate electrode continuously in said column direction across a plurality of memory cells.

7. A method of manufacturing a non-volatile memory cell in a substantially single crystalline semiconductive substrate of a first conductivity type, wherein said non-volatile memory cell for storing a plurality of bits, said method comprising:

forming a first and a second spaced apart trenches into the surface of the substrate, each of said first and second trenches having a sidewall and a bottom wall;

forming a first region and a second region in said bottom wall of said first and second trenches, respectively, with said first region and said second region being of a second conductivity type, different from said first conductivity type, with a channel region for the conduction of charges connecting said first region and said second region; said channel region, having a first portion, a second portion and a third portion;

forming a dielectric on said channel region;

forming a first floating gate an said dielectric, in said first trench spaced apart from said sidewall of said first trench and from said first portion of said channel region; said first portion of said channel region adjacent to said first region, said first floating gate for the storage of at least one of said plurality of bits;

forming a second floating gate on said dielectric, in said second trench spaced apart from said sidewall of said second trench and from said second portion of said channel region; said second portion of said channel region adjacent to said second region, said second floating gate for the storage of at least another of said plurality of bits;

forming a gate electrode on said dielectric, spaced apart from said third portion of said channel region, said third portion of said channel region between said first portion and said second portion;

forming a first gate electrode in said first trench, said first gate electrode electrically connected to said first region and capacitively coupled to said first floating gate; and forming a second gate electrode in said second trench, said second gate electrode electrically connected to said second region and capacitively coupled to said second floating gate.

8. The method of claim 7 wherein said step of forming a gate electrode on said dielectric further includes forming an insulation material between the gate electrode and said first and second floating gates with a thickness that permits Fowler-Nordheim tunneling of electrons from said first and second floating gates to said gate electrode.

9. The method of claim 8 wherein said step of forming said first and second floating gates includes forming said first and second floating gates above the substrate surface.

* * * * *